United States Patent
Jung

(10) Patent No.: US 7,169,672 B1
(45) Date of Patent: Jan. 30, 2007

(54) SPLIT GATE TYPE NONVOLATILE MEMORY DEVICE AND MANUFACTURING METHOD THEREOF

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/323,821

(22) Filed: Dec. 30, 2005

(30) Foreign Application Priority Data

Oct. 4, 2005 (KR) ............... 10-2005-0092979

(51) Int. Cl.
*H01L 21/8247* (2006.01)

(52) U.S. Cl. ............... 438/266; 257/E21.179
(58) Field of Classification Search ........ 438/257–267; 257/E21.179
See application file for complete search history.

(56) References Cited

U.S. PATENT DOCUMENTS

| | | | |
|---|---|---|---|
| 6,727,144 B2* | 4/2004 | Hashimoto | 438/257 |
| 7,034,354 B2* | 4/2006 | Lee et al. | 257/311 |
| 2002/0142545 A1* | 10/2002 | Lin | 438/257 |
| 2004/0157422 A1* | 8/2004 | Han | 438/594 |
| 2005/0208744 A1* | 9/2005 | Jeon et al. | 438/593 |

\* cited by examiner

*Primary Examiner*—Richard A. Booth
(74) *Attorney, Agent, or Firm*—Andrew D. Fortney

(57) ABSTRACT

A method for fabricating a nonvolatile memory device comprises the steps of: defining an active region in a semiconductor substrate; forming a charge trapping layer, a first conducting layer and a capping layer on the active region; patterning the capping layer to form a pair of caps; forming a first conducting pattern having a width defined by the pair of caps; depositing a second conducting layer on the substrate to cover the first conducting pattern; forming a first photoresist pattern on the second conducting layer, the first photoresist pattern having an opening over a portion of the active region between the pair of caps; selectively etching the second conducting layer using the first photoresist pattern as an etch mask, and at the same time selectively etching the first conducting pattern with the pair of caps as an etch mask, to form a pair of first gates.

11 Claims, 6 Drawing Sheets

SPLIT GATE TYPE NONVOLATILE MEMORY DEVICE AND MANUFACTURING METHOD THEREOF

This application claims the benefit of Korean Application No. 10-2005-0092979, filed on Oct. 4, 2005, which is hereby incorporated by reference in its entirety.

BACKGROUND OF THE INVENTION

1. Field of the Invention

The present invention relates to a semiconductor memory device technology. More specifically, the present invention relates to nonvolatile memory devices having a split gate structure and a fabrication method thereof.

2. Description of the Related Art

Flash memory, which is capable of retaining stored data without continued supply of electrical power, typically has a stacked gate structure including a floating gate and a control gate. The floating gate, which is between the control gate and the semiconductor substrate, is isolated by an insulating oxide layer. The flash memory device may be classified, according to its cell array structure, into NOR flash and NAND flash types. The NAND flash has higher integration and is suitable for use in electronic devices requiring high storage capacity. The NOR flash memory allows for higher speed operation and random access to the memory cells, but it generally uses space for the each of memory cells for interconnection to a bit line. NOR flash memory also generally has a relatively low integrity.

The NOR flash memory devices have a plurality of memory cells arrayed in row and column directions. Memory cells placed in a row direction are connected in parallel to bit lines, while memory cells placed in a column direction are connected in parallel to word lines. As the memory cells are connected to parallel bit lines, when the cell transistor's threshold voltage becomes lower than the voltage applied to the word line of non-selected memory cells (typically "0" voltage), current may flow between the source and drain regions, which causes an error (e.g., false recognition of certain cells being turned-on). For overcoming this problem, split gate type nonvolatile memory devices are developed.

In the meanwhile, the stacked gate nonvolatile memory device structures may also be divided into FLOTOX (floating-gate-tunnel-oxide) flash memory; and SONOS (silicon-oxide-nitride-oxide-silicon) devices, having multiple oxide and/or dielectric layers and a structure similar to a conventional metal oxide semiconductor (MOS) transistor. The SONOS device includes a charge trapping dielectric layer, which stores charges in deep level trap, thereby providing reliability and allowing erasing and programming operations at a low voltage.

FIGS. 1 to 3 are cross-sectional views for illustrating conventional split gate type nonvolatile memory device.

Referring to FIG. 1, an isolation region (not shown) for defining an active region 11 where microcircuit elements such as memory cells are to be fabricated, a charge trapping layer, a first conducting layer and a capping layer are formed in and on a semiconductor substrate 10. The charge trapping layer is, in the case of SONOS devices, an insulating layer that is interposed between tunnel oxide and blocking oxide layers and has high trap density (typically, an oxide-nitride interface in a silicon oxide-silicon nitride-silicon oxide (ONO) stack). A silicon layer (e.g., polysilicon) may be formed thereon (e.g., to function as a control gate) and a silicon nitride layer (e.g., to function as a hard mask) are generally formed on the ONO stack.

By successively patterning the capping layer, the first conducting layer and the charge trapping layer, the first conducting pattern 16 on a charge trapping layer 14 on the active region 11, and oxide pattern 18 and nitride pattern 20 on the first conducting layer 16 may be obtained.

Referring to FIG. 2, spacer insulating layers 22 are formed on sidewalls of the first conducting layer 16, and a gate oxide layer 24 is formed on the active region. A conformal second conducting layer 26 (e.g., polysilicon) is formed on the gate oxide layer 24. At this stage, the second conducting layer 26 has a groove "G" between the first conducting patterns 16. Then, a photoresist pattern 28 is formed on the second conducting layer 26.

Referring to FIG. 3, the second conducting layer 26 is patterned using the photoresist pattern 28 as an etch mask to expose portions of the active region between neighboring first conducting patterns 16. The removal of the second conducting layer 26 is done by anisotropic etching. However, sidewalls of the second conducting layer 26, which are formed at the groove "G" may not be properly etched because polymers or byproducts may accumulate thereon during the anisotropic etching process. As a result, electrically conductive stringers 30 remain on the substrate surface after the second conducting layer 26 is etched to expose the gate oxide layer 24.

With the stringers 30 remaining on the substrate, subsequent silicidation is hindered, which leads to an increase in resistance of the active region and of contact resistance, and the stringers 30 may produce particles in following processing steps.

For avoiding the stringer problem, one may consider increasing a time for overetching the second conducting layer 26. In this case, however, the silicon oxide layer formed on the substrate may be removed and the substrate can be damaged. Further, when the topology of the second conducting layer 26 is reduced for alleviating the stringer problem, the first conducting pattern 16 and capping patterns 18 and 20 are generally made thinner. However, this causes an increase in the resistance of the first conducting layer 16. Furthermore, the thinner capping patterns 18 and 20 may increase parasitic capacitance between the first and second conducting layers 16 and 26.

SUMMARY OF THE INVENTION

It is, therefore, an object of the present invention to provide split gate nonvolatile memory device and fabrication method thereof, which can prevent the conductive stringer problem between the first conducting layers and solve the misalignment problem.

To achieve the above objects, an embodiment of a method for fabricating a nonvolatile memory device comprises the steps of: (a) defining an active region in a semiconductor substrate; (b) forming a charge trapping layer, a first conducting layer and a capping layer on the active region; (c) patterning the capping layer to form a pair of separated gate caps; (d) forming a first conducting pattern having a width defined by the pair of separated gate caps; (e) depositing a second conducting layer on the substrate to cover the first conducting pattern; (f) forming a first photoresist pattern on the second conducting layer, the first photoresist pattern having an opening over a portion of the active region between the pair of separated gate caps; and (g) selectively etching the second conducting layer using the first photoresist pattern as an etch mask, and at the same time selectively etching the first conducting pattern using the pair of separated gate caps as an etch mask, to form a pair of separated first gates. The method may further comprise (h) patterning the second conducting layer to form a pair of word lines overlapping the active region and the pair of first gates, either as a separate step or as part of the selectively etching step (g).

These and other aspects of the invention will become evident by reference to the following description of the invention, often referring to the accompanying drawings.

DETAILED DESCRIPTION OF THE INVENTION

Hereinafter, embodiments of a nonvolatile memory device and fabrication method thereof, according to the present invention, will be described with reference to FIGS. 4 to 9, which are cross-sectional views for illustrating an exemplary method of fabricating a split gate nonvolatile memory device according to the present invention.

Figure 1:
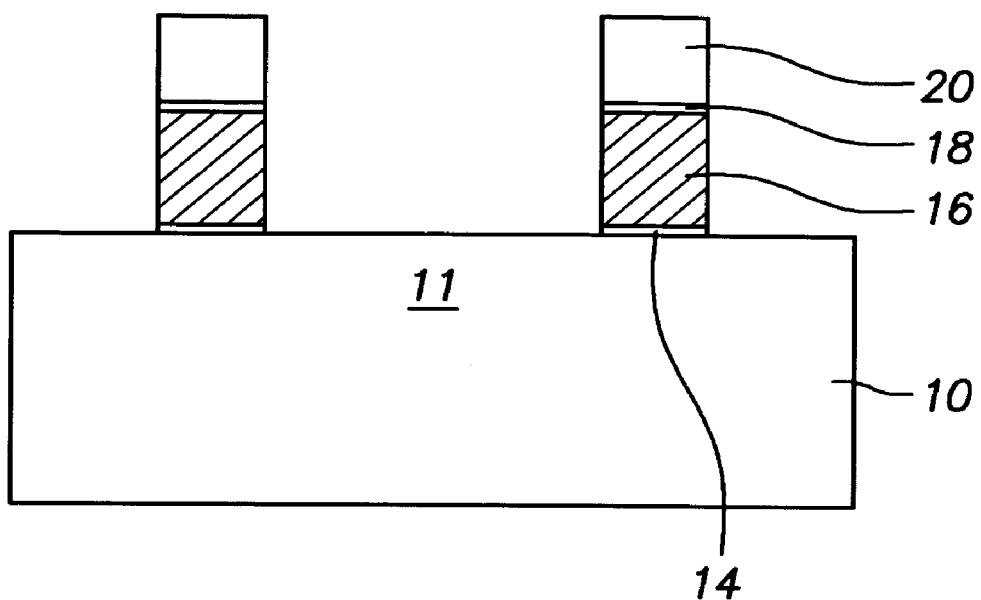
FIGS. 1 to 3 are cross-sectional views for illustrating a method of making a conventional split gate type nonvolatile memory device.
Figure 2:
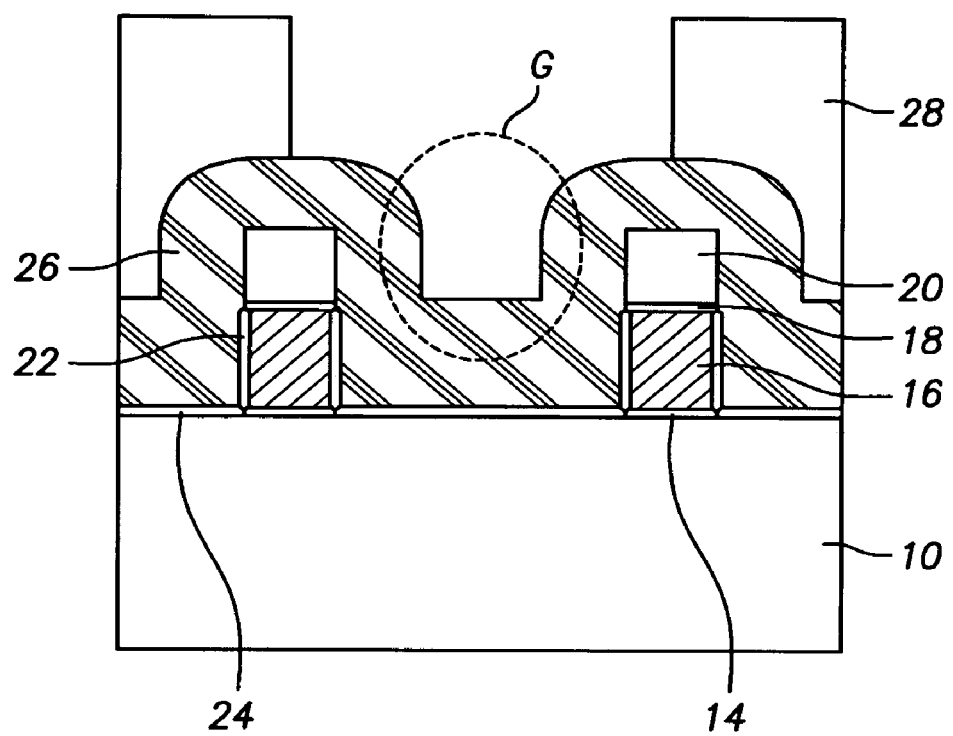
Figure 3:
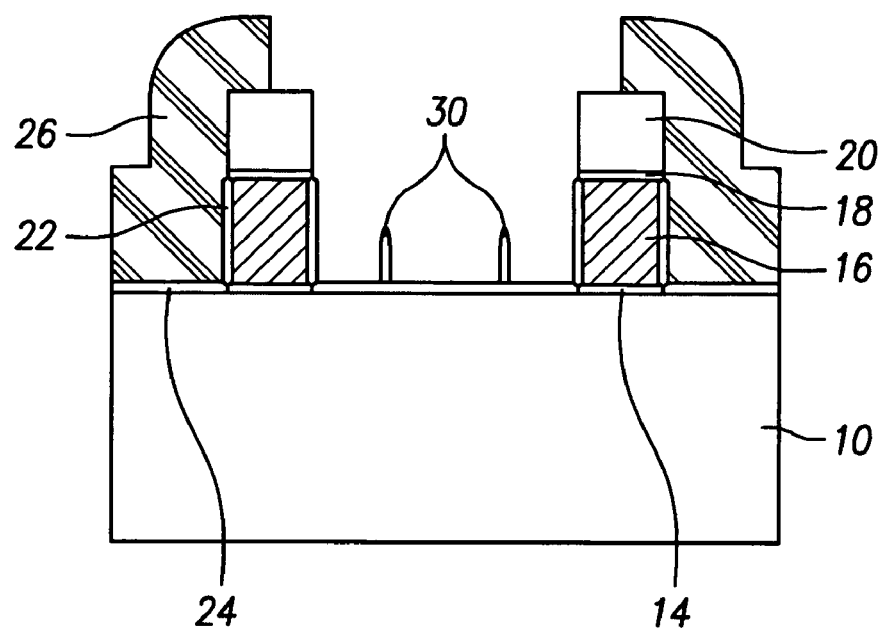
Figure 4:
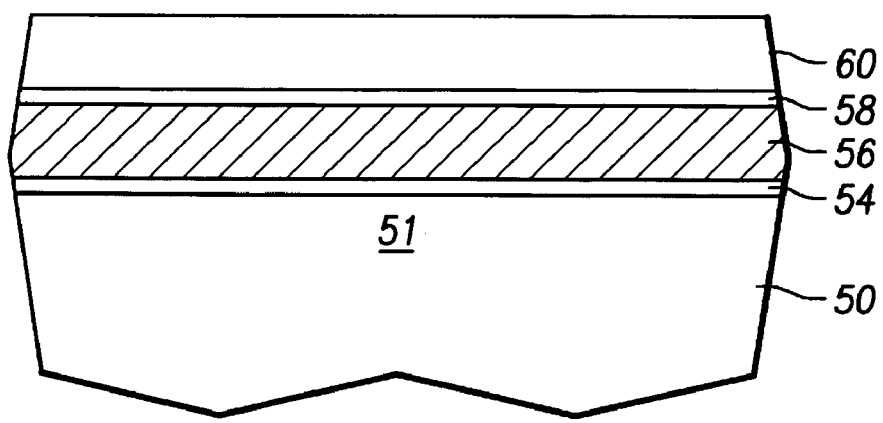
FIGS. 4 to 9 are cross-sectional views for illustrating a method of fabricating a split gate nonvolatile memory device according to the present invention.

Referring to FIG. 4, an isolation layer (not shown), which defines an active region 51, a charge trapping layer 54, a first conducting layer 56 (e.g., comprising polysilicon, which may be [heavily] doped to improve its conductivity) and capping layers 58 and 60 are formed on a semiconductor substrate 50. The capping layers may comprise a stacked silicon buffer oxide 58 and silicon nitride hard mask layer 60. The charge trapping layer 54 may comprise either an ONO layer in the case of a SONOS memory device or a tunnel oxide layer-floating gate-blocking oxide or ONO layer in the case of a FLOTOX memory device. While following description is given with reference to the SONOS device, one skilled in the art would easily understand that the technical features of the present invention can also be applied to the stacked FLOTOX gate device without departing from the spirit and/or scope of the present invention.

Figure 5:
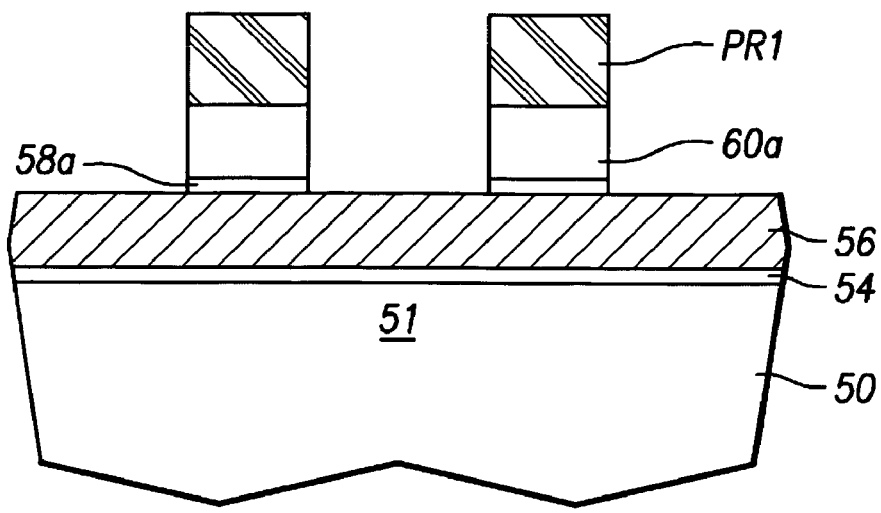

Referring to FIG. 5, a photoresist pattern (PR1) is formed on the silicon nitride layer 60. As explained below, the photoresist pattern (PR1) has preferably a width of the final split gate (or control gate) 56b (see, e.g., FIG. 9). The capping layers 58 and 60 are patterned using the photoresist pattern (PR1) as a mask, so that a pair of caps, each of which comprises a silicon oxide pattern 58a and a silicon nitride pattern 60a, are formed.

Figure 6:
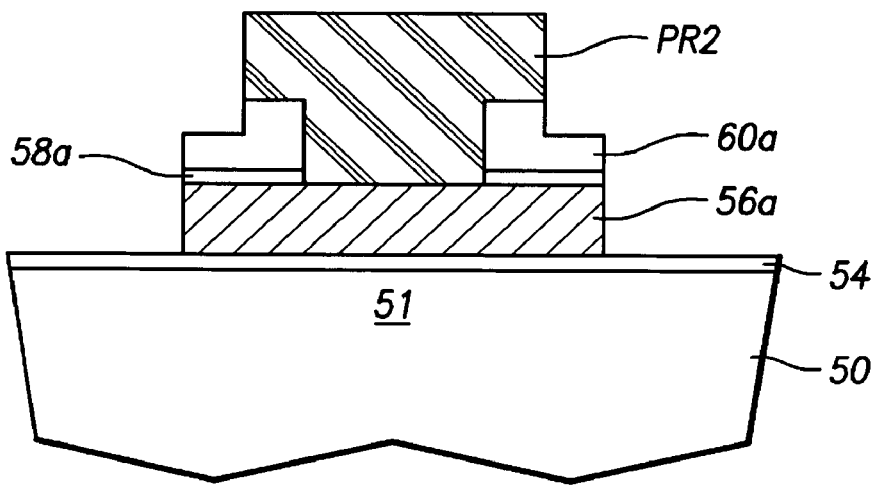

Subsequently, as shown in FIG. 6, the photoresist pattern (PR1) may be (and preferably is) removed, and a second photoresist pattern (PR2) is formed on the pair of gate caps 58a and 60a. At this stage, the second photoresist pattern (PR2) covers the first conducting layer 56 between the pair of caps 58a and 60a as well as at least part of each cap 58a and 60a. The width of the second photoresist pattern (PR2) should not exceed the distance between opposing outer sides of the caps 58a and 60a, and is not less than the distance between the facing inner sides of the caps 58a and 60a.

Then, a first conducting pattern 56a is formed by selectively etching the first conducting layer 56 using the second photoresist pattern (PR2) and the silicon nitride pattern 60a as an etch mask. In this etching process, a part of the silicon nitride pattern 60a which is not covered by the second photoresist pattern (PR2) may be removed. Thus, each cap may have a notch therein at its upper, outermost edge or corner.

Figure 7:
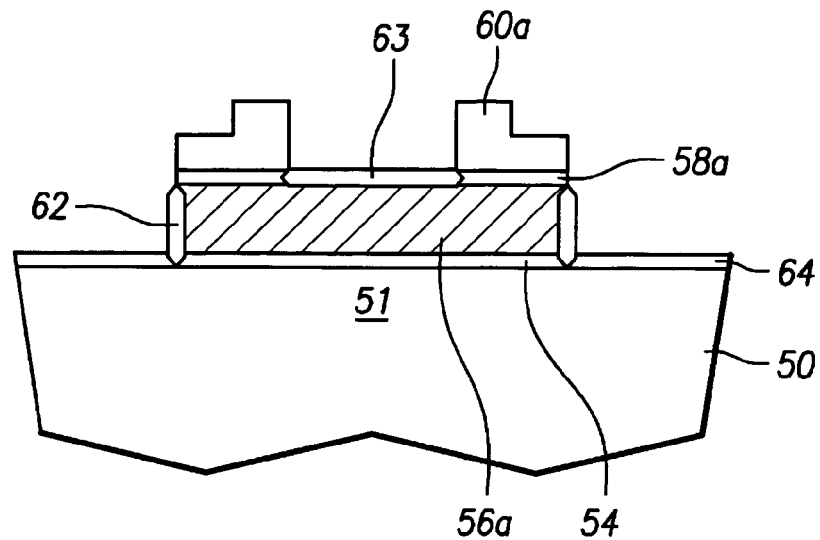

Referring to FIG. 7, the second photoresist pattern (PR2) is removed. Subsequently, the first conducting pattern 56a is oxidized to form sidewall insulating layer 62 and upper insulating layer 63. Sidewall insulating layer 62 may cure or repair damage to the sidewall during the formation (etching) of the first conducting pattern 56a. The sidewall spacers 62 and the upper insulating layer 63 also electrically separate or isolate the first conducting pattern 56a and a subsequently formed second conducting layer 66. Then, except for a portion of the charge trapping layer 54 under the first conducting pattern 56a, the charge trapping layer 54 exposed on the active region is removed, and a gate oxide layer 64 is formed on the substrate.

Figure 8:
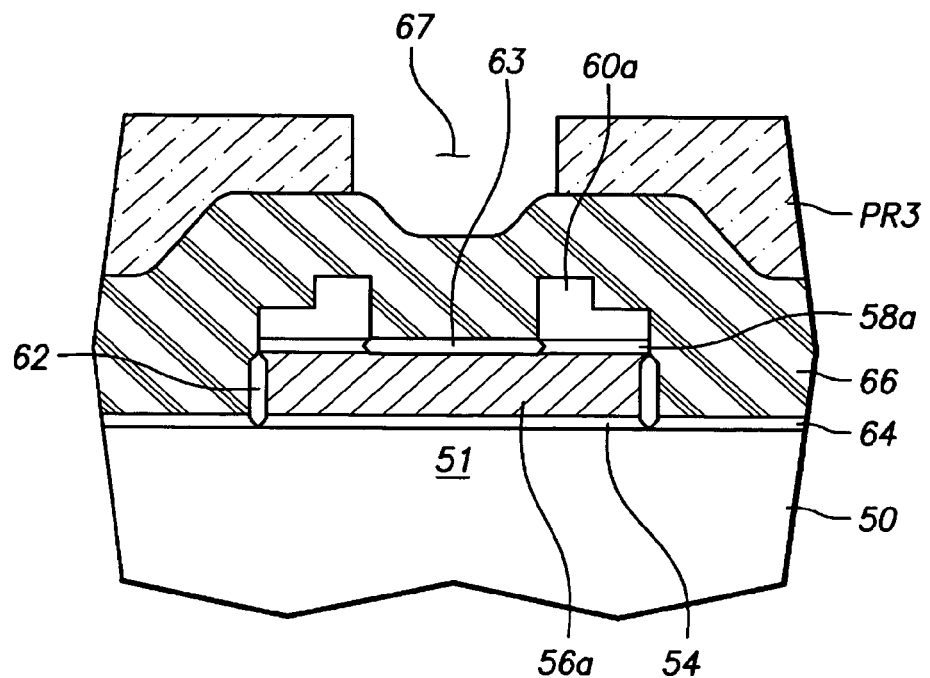

Referring to FIG. 8, a second conducting layer 66 (also comprising. e.g., polysilicon, which may be [heavily] doped to improve its conductivity) is conformally formed on the entire substrate surface, including the gate oxide layer 64. Then, a third photoresist pattern (PR3) having an opening 67 is formed on the second conducting pattern 66. The opening 67 is formed over the substrate surface including the first conducting pattern 56a between the pair of caps 58a/60a, and a part of the second conducting pattern 66 is exposed through the opening 67.

Figure 9:
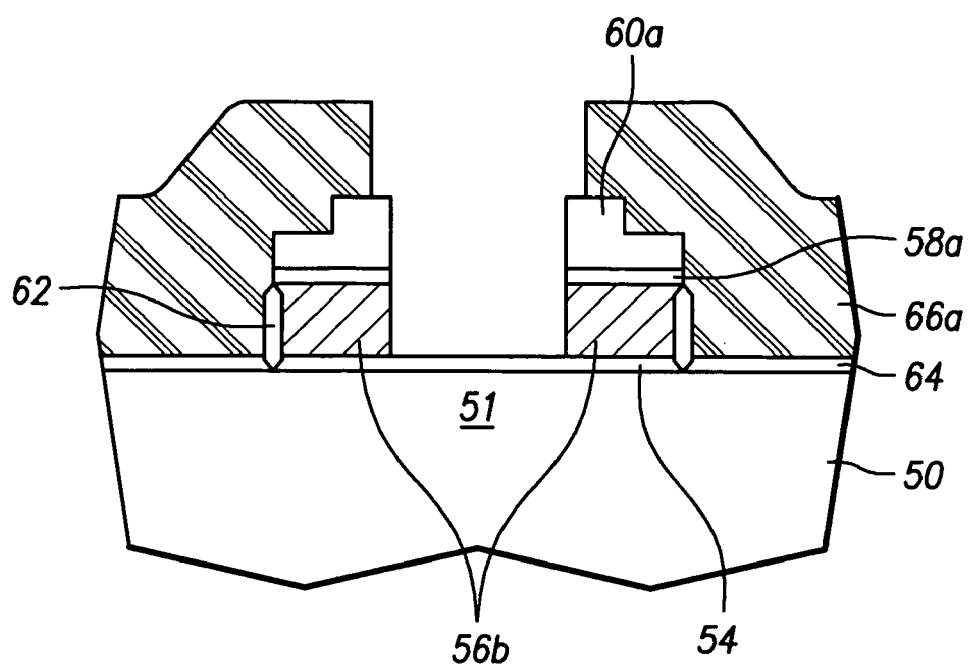

Referring to FIG. 9 the second conducting layer 66, the upper insulating layer 63 and the first conducting pattern 56a are selectively etched using the third photoresist pattern (PR3) as an etch mask to form a pair of first gates 56b that have sidewalls facing each other. In this process, the silicon nitride pattern 60a protects the underlying first conducting pattern 56a. With this etching process, each of the first gates 56b has the same width as the caps 58a and 60a.

When the third photoresist pattern (PR3) is formed by a photolithographic process, the position of the opening 67 may be misaligned. If the opening 67 deviates to one direction from the first conducting pattern 56a in FIG. 8, each of the first gates 56b may have different line width. However, in the present invention, the first gates 56b have the same line width as the corresponding caps 60a, regardless of any misalignment of the opening 67, because the silicon nitride pattern 60a functions an etch mask when forming the first conducting pattern 56a.

Subsequently, the second conducting layer 66 is patterned according to a typical process for making the split gate nonvolatile memory device to form a pair of word lines 66a.

With this structure of the nonvolatile memory device, the conventionally formed groove is not produced during the formation of the second conducting layer between the pair of first conducting pattern layers 56b, or even when the groove is formed, its topology reduces or prevents formation of electrically conductive stringers.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a nonvolatile memory device, said method comprising the steps of:
   defining an active region in a semiconductor substrate;
   forming a charge trapping layer, a first conducting layer and a capping layer on the active region;
   patterning the capping layer to form a pair of caps;

forming a first conducting pattern having a width defined by the pair of caps;

depositing a second conducting layer on the substrate to cover the first conducting pattern;

forming a first photoresist pattern on the second conducting layer, said first photoresist pattern having an opening over a portion of the active region between the pair of caps; and selectively etching the second conducting layer using the first photoresist pattern as an etch mask, and at the same time selectively etching the first conducting pattern using the pair of caps as an etch mask, to form a pair of first gates.

2. The method of claim 1, further comprising patterning the second conducting layer to form a pair of word lines overlapping the active region and the pair of first gates.

3. The method of claim 1, wherein the step for forming the pair of capping layer patterns comprises the steps of:

forming, on the capping layer, a second photoresist pattern for defining a width of the pair of first gates;

selectively etching the capping layer using the second photoresist pattern as an etch mask to form the pair of caps; and removing the second photoresist pattern.

4. The method of claim 1, wherein the step for forming the first conducting pattern comprises the steps of:

forming a third photoresist pattern on the pair of caps and on the first conducting layer between the pair of caps;

selectively etching the first conducting layer using the third photoresist pattern as an etch mask to form the first conducting pattern; and removing the third photoresist pattern.

5. The method of claim 1, further comprising forming a sidewall insulating layer and an upper insulating layer on sidewall and upper surfaces of the first conducting layer pattern, before forming the second conducting layer.

6. The method of claim 1, further comprising removing a part of the charge trapping layer on a portion of the active region exposed by the first conducting pattern; and forming a gate oxide on the portion of the active region, before forming the second conducting layer.

7. The method of claim 1, wherein the capping layer includes a silicon oxide layer and a silicon nitride layer.

8. The method of claim 1, wherein the charge trapping layer comprises a silicon oxide-silicon nitride-silicon oxide layer stack.

9. The method of claim 1, wherein the charge trapping layer comprises a tunnel oxide layer-polysilicon layer-ONO layer stack.

10. The method of claim 1, wherein the charge trapping layer comprises a tunnel oxide layer-polysilicon layer-blocking oxide stack.

11. A method for fabricating a nonvolatile memory device, comprising the steps of:

patterning a capping layer on a first conducting layer to form a pair of caps, the first conducting layer on a charge trapping layer in an active region of the nonvolatile memory device;

forming a first conducting pattern from the first conducting layer, the first conducting pattern having a width defined by the pair of caps;

depositing a second conducting layer on the active region and covering the first conducting pattern; and forming an opening in the second conducting layer and the first conducting pattern over a portion of the active region between the pair of caps, to form a pair of first gates.

* * * * *